United States Patent
Chen et al.

(10) Patent No.: US 8,441,169 B2
(45) Date of Patent: May 14, 2013

(54) VOLTAGE CONVERTER AND DRIVING SYSTEM USING SUCH VOLTAGE CONVERTER

(75) Inventors: Shih Chang Chen, Hsin-Chu (TW); Ying Lun Chang, Hsin-Chu (TW); Rong Ho Yu, Hsin-Chu (TW); Daw Ping Chang, Hsin-Chu (TW); Kuei Liang Chiang, Hsin-Chu (TW)

(73) Assignee: Microjet Technology Co., Ltd., Hsin-Chu (TW)

( * ) Notice: Subject to any disclaimer, the term of this patent is extended or adjusted under 35 U.S.C. 154(b) by 228 days.

(21) Appl. No.: 12/782,408

(22) Filed: May 18, 2010

(65) Prior Publication Data

US 2010/0301701 A1 Dec. 2, 2010

(30) Foreign Application Priority Data

May 26, 2009 (CN) .......................... 2009 1 0145558

(51) Int. Cl.
*H01L 41/09* (2006.01)
(52) U.S. Cl.
USPC .............................. 310/317; 310/319; 363/17

(58) Field of Classification Search ............... 310/317, 310/319; 363/17
See application file for complete search history.

(56) References Cited

U.S. PATENT DOCUMENTS

| | | | |
|---|---|---|---|
| 6,747,425 B2 * | 6/2004 | Marshall et al. | 318/400.26 |
| 2003/0234736 A1 * | 12/2003 | Tachibana et al. | 341/172 |
| 2006/0153361 A1 * | 7/2006 | Chen | 379/413.01 |
| 2007/0086217 A1 * | 4/2007 | Zhang et al. | 363/17 |

* cited by examiner

*Primary Examiner* — Walter Benson
*Assistant Examiner* — Bryan Gordon
(74) *Attorney, Agent, or Firm* — Muncy, Geissler, Olds & Lowe, PLLC

(57) ABSTRACT

A voltage converter is provided for receiving a low input DC voltage and driving a piezoelectric actuator of a fluid transportation device. The voltage converter includes plural capacitors, a resistor and a boost chip. The boost chip is connected with the plural capacitors and the resistor, has a switch element and a polar switching circuit, and receives the low input DC voltage. The low input DC voltage is increased and multiplied to a high DC voltage by a switching operation of the switch element. The high DC voltage is converted into an output AC voltage by the polar switching circuit so as to drive the piezoelectric actuator. An operating frequency of the boost chip is controlled by the plural capacitors and the resistor.

6 Claims, 9 Drawing Sheets

VOLTAGE CONVERTER AND DRIVING SYSTEM USING SUCH VOLTAGE CONVERTER

BACKGROUND OF THE INVENTION

1. Field of the Invention

The present invention relates to a voltage converter, and more particularly to a voltage converter and a driving system using such a voltage converter.

2. Description of Related Art

With increasing development of high-tech industries, various 3C products are considered as the main power for advancing the market growth. Of course, the development of high-tech industries is unceasing. In addition, as the progress of the micro-electronic technology is continuously made, the functions of the 3C products become elaborate and the trends of designing 3C products are toward miniaturization. Moreover, for facilitating the user to easily operate the 3C products, the portability thereof is largely enhanced.

For example, 3C products include computers, mobile phones, digital cameras, and the like. Since the volume of the 3C product is gradually reduced, the components within the 3C product should be as small as possible. Generally, a voltage converter is used to increase and convert a DC voltage into an AC voltage. For meeting the market's requirements, the volume of the voltage converter needs to be minimized.

FIG. 1 is a schematic circuit diagram illustrating a conventional voltage converter. As shown in FIG. 1, the conventional voltage converter 10 comprises a timing generation circuit 11, plural switch elements 12, a boost transformer 13, a capacitor C1 and an inductor L1. The voltage converter 10 is used for receiving a DC voltage Vdc, and converting and increasing the DC voltage Vdc into an AC voltage Vac. The operations of the conventional voltage converter 10 will be illustrated as follows. Firstly, the DC voltage Vdc is received. In response to a control signal outputted from the timing generation circuit 11, the plural switch elements 12 are controlled to be alternately conducted and shut off. By alternately turning on/off the switch elements 12, the DC voltage Vdc (e.g. from +5V to +12V) is processed by the loop including the inductor L1, the capacitor C1, the boost transformer 13 (1:20) and the switch elements 12. As such, the secondary side of the boost transformer 13 outputs the AC voltage Vac, which has an increased voltage value complying with the practical requirements.

Although the conventional voltage converter 10 is capable of converting and increasing the DC voltage into the AC voltage, there are still some drawbacks. For example, the trend of designing the voltage converter is toward miniaturization. Since the conventional voltage converter 10 uses the boost transformer 13 and the boost transformer 13 occupies much layout space, the volume of the conventional voltage converter 10 is bulky and fails to meet the miniaturization requirement.

Therefore, there is a need of providing a voltage converter and a driving system using such a voltage converter so as to obviate the drawbacks encountered from the prior art

SUMMARY OF THE INVENTION

It is an object of the present invention to provide a voltage converter and a driving system using such a voltage converter in order to obviate the drawbacks of using the boost transformer, which has bulky volume and the product fails to meet the miniaturization requirement.

In accordance with an aspect of the present invention, there is provided a voltage converter for receiving a low input DC voltage and driving a piezoelectric actuator of a fluid transportation device. The voltage converter includes plural capacitors, a resistor and a boost chip. The boost chip is connected with the plural capacitors and the resistor, has a switch element and a polar switching circuit, and receives the low input DC voltage. The low input DC voltage is increased and multiplied to a high DC voltage by a switching operation of the switch element. The high DC voltage is converted into an output AC voltage by the polar switching circuit so as to drive the piezoelectric actuator. An operating frequency of the boost chip is controlled by the plural capacitors and the resistor.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
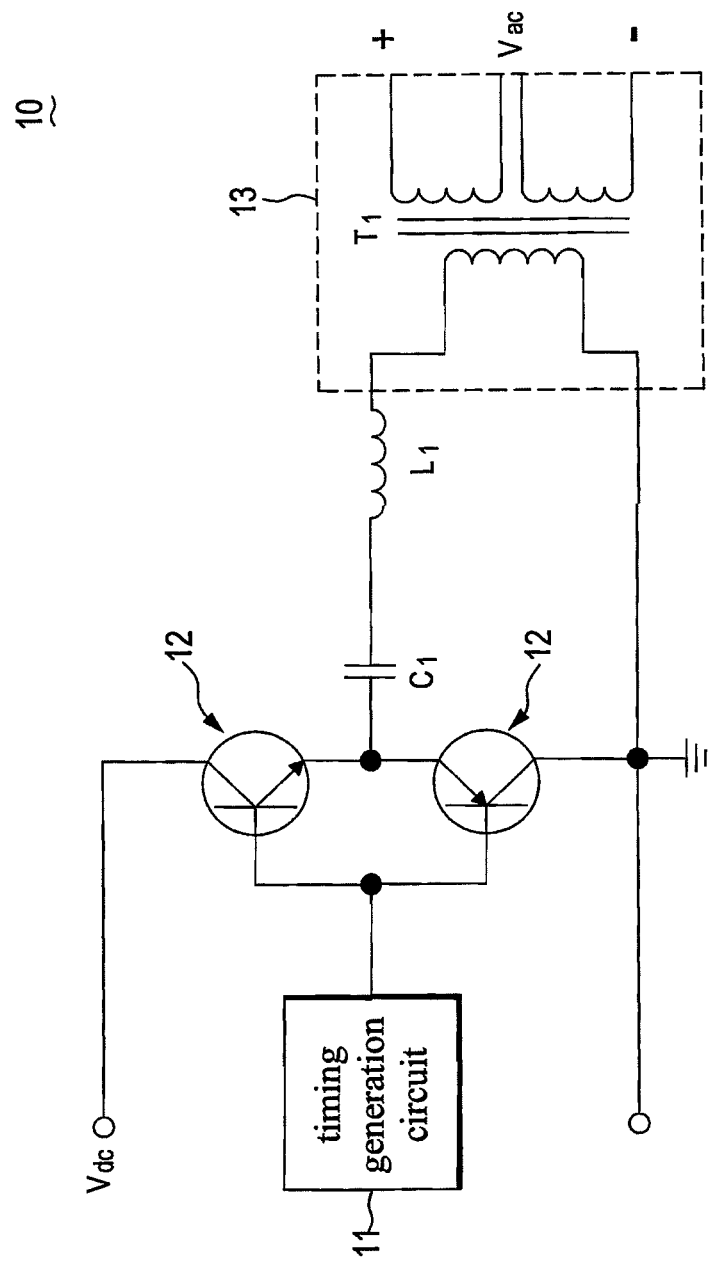
FIG. 1 is a schematic circuit diagram illustrating a conventional voltage converter.
Figure 2A:
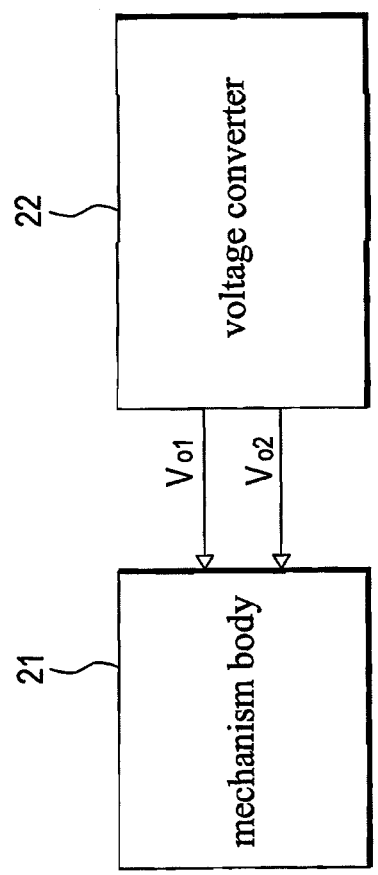
FIG. 2A is a schematic circuit diagram illustrating a driving system according to an embodiment of the present invention.

FIG. 2A is a schematic circuit diagram illustrating a driving system according to an embodiment of the present invention. The driving system 2 comprises a mechanism body 21 and a voltage converter 22. The voltage converter 22 is connected with the mechanism body 21. The voltage converter 22 is used for receiving a low input DC voltage and converting the input DC voltage into output AC voltages Vo1 and Vo2 required for driving the mechanism body 21.

Figure 2B:
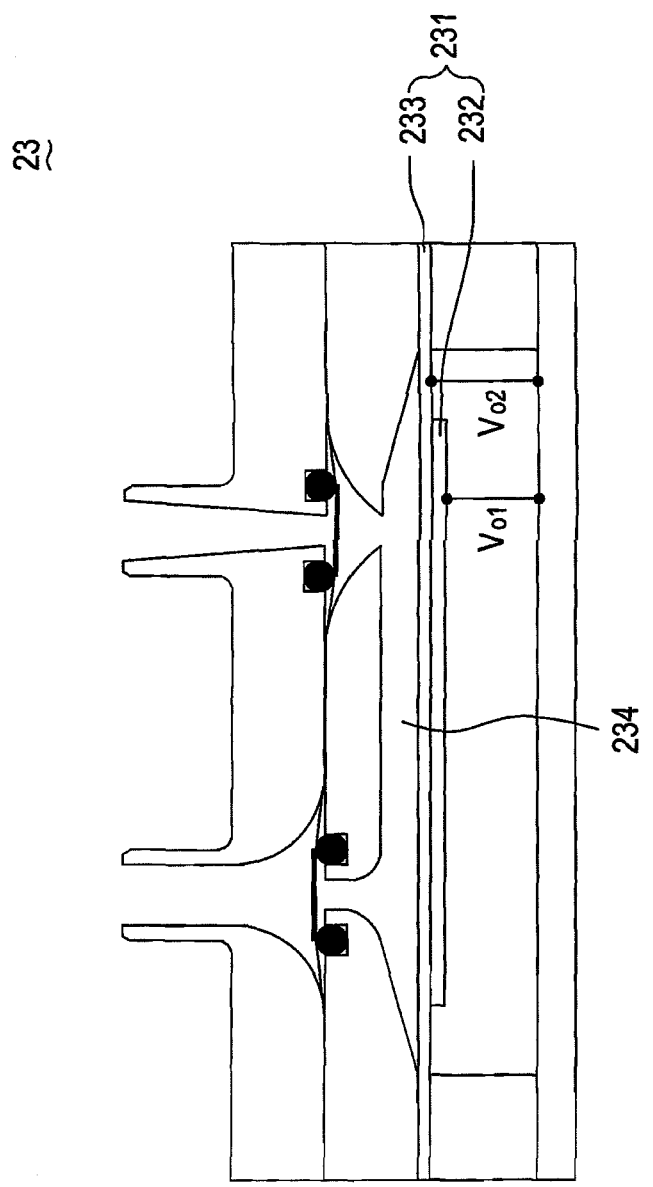
FIG. 2B is a schematic cross-sectional view illustrating an exemplary mechanism body of the driving system as shown in FIG. 2A.

FIG. 2B is a schematic cross-sectional view illustrating an exemplary mechanism body of the driving system as shown in FIG. 2A. As shown in FIG. 2B, an exemplary mechanism body 21 includes but is not limited to a fluid transportation device 23. The fluid transportation device can be used in many industries such as pharmaceutical and biotechnology industries, computer techniques, printing industries or energy industries for transporting gases or liquids. The fluid transportation device 23 utilizes a piezoelectric actuator 231 for converting electrical energy into mechanical energy. In this embodiment, the piezoelectric actuator 231 comprises an actuating slice 232 and a vibration film 233 for receiving the output AC voltages Vo1 and Vo2, respectively. The actuating slice 232 and the vibration film 233 are driven by the Vo1 and Vo2 to result in reciprocating motions. As such, the volume of a pressure cavity 234 is expanded or shrunk in order to achieve the purpose of transporting the fluid.

Figure 3:
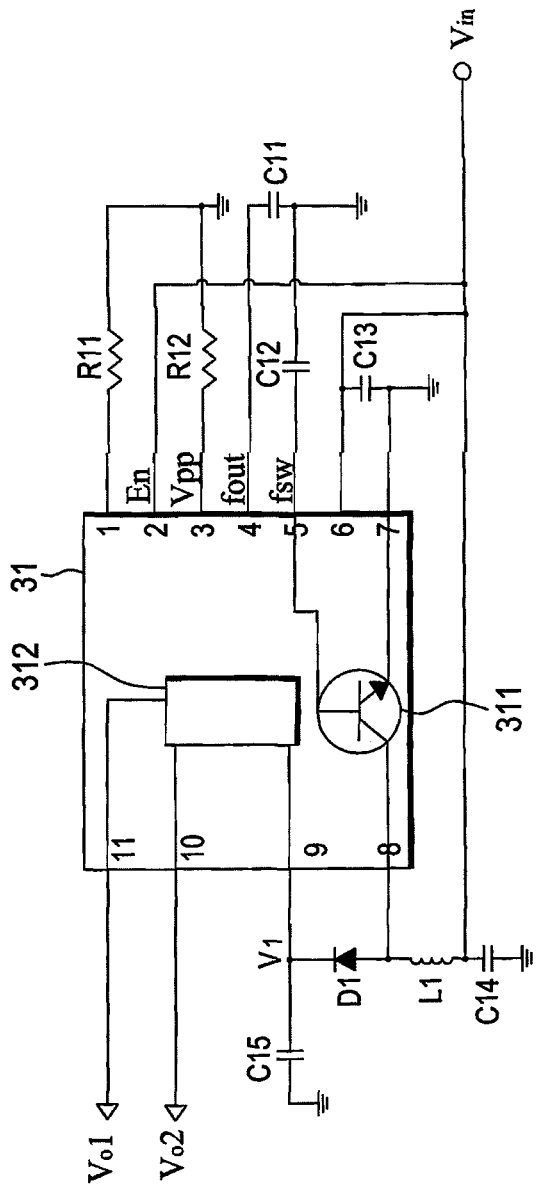
FIG. 3 is a schematic circuit diagram illustrating a first exemplary voltage converter as shown in FIG. 2A.

FIG. 3 is a schematic circuit diagram illustrating a first exemplary voltage converter as shown in FIG. 2A. As shown in FIG. 3, the voltage converter 3 is used for receiving a low input DC voltage Vin and converting the input DC voltage Vin into output AC voltages Vo1 and Vo2. The voltage converter 3 comprises a boost chip 31, plural capacitors, plural resistors, an inductor L1 and a diode D1.

In this embodiment, the plural capacitors comprise the capacitors C11, C12, C13, C14 and C15. The plural resistors comprise resistors R11 and R12. The boost chip 31 comprises a switch element 311 and a polar switching circuit 312. The switch element 311 is a high-voltage resistant switch element.

The operations of the boost chip 31 will be illustrated as follows. Firstly, the low input DC voltage Vin is received by the boost chip 31. By the on/off switching operation of the switch element 311 and the cooperation of the inductor L1, the diode D1 and the capacitors C14 and C15, the low input DC voltage Vin is increased and multiplied to a high DC voltage V1. Then, the high DC voltage V1 is transmitted to the polar switching circuit 312, so that the high DC voltage V1 is converted into the output AC voltages Vo1 and Vo2.

For example, in some embodiments, the low input DC voltage Vin is ranged between DC+3V~+12V. By the switch element 311, the inductor L1, the diode D1 and the capacitors C14 and C15, the low input DC voltage Vin is increased to the high DC voltage V1, which is higher than DC+100V. By the polar switching circuit 312, the high DC voltage V1 is converted into the output AC voltages Vo1 and Vo2, which are higher than 100V.

Please refer to FIG. 3 again. The boost chip 31 is controlled according to three digital signals En, fout and fsw and an analog signal Vpp. According to the digital signal En, the boost chip 31 will control whether the output AC voltages Vo1 and Vo2 are outputted. According to the analog signal Vpp, the boost chip 31 will control the amplitudes of the output AC voltages Vo1 and Vo2 (i.e. the magnitudes of the output AC voltages Vo1 and Vo2). According to the digital signal fout, the output switching frequency is controlled. According to the digital signal fsw, the driving frequency of operating the switch element 311 of the boost chip 31 is determined. In this embodiment, the digital signal fout is provided by the capacitor C11, the digital signal fsw is provided by the capacitor C12, and the analog signal Vpp is provided by the resistor R12.

Moreover, the inductor L1 is used for temporarily storing and transferring energy. By the capacitor C13, the low input DC voltage Vin could be stably provided to the boost chip 31. The capacitors C14 and C15 are used for temporarily storing energy. The resistor R11 is used for determining the ascending slopes of the output AC voltages Vo1 and Vo2 and the boost switching frequency.

Figure 4B:
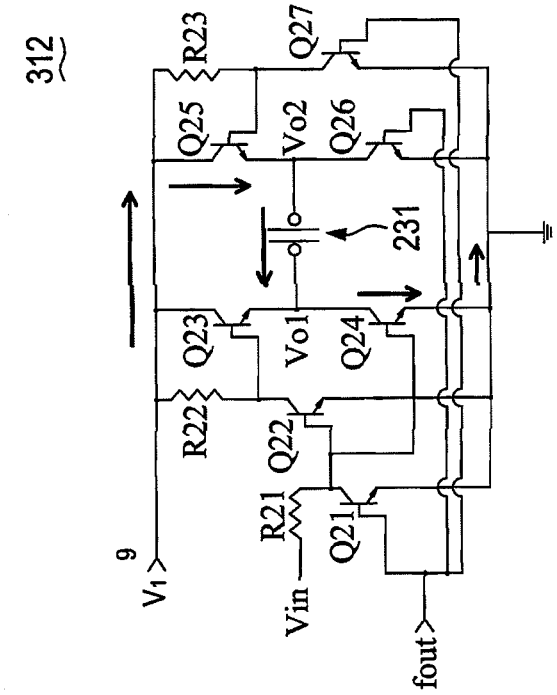
FIG. 4B is a schematic circuit diagram illustrating the polar switching circuit of FIG. 4A, in which the digital signal fout is in a low-level state.
Figure 4A:
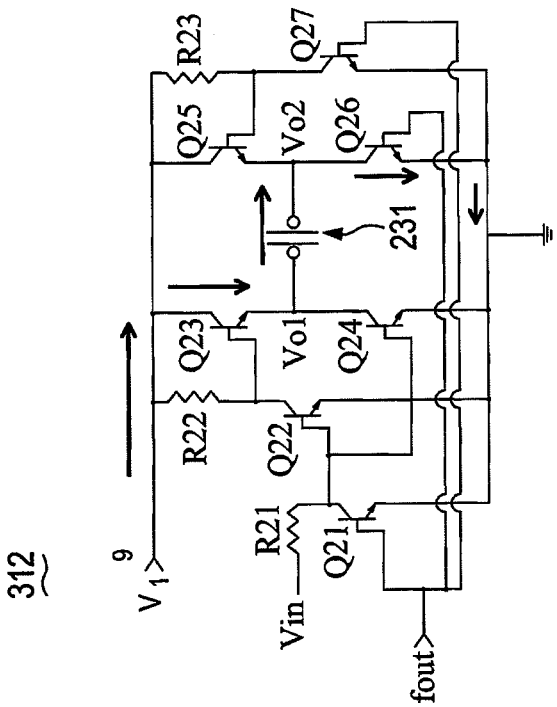
FIG. 4A is a schematic circuit diagram illustrating a polar switching circuit used in the voltage converter of FIG. 3.

FIG. 4A is a schematic circuit diagram illustrating a polar switching circuit used in the voltage converter of FIG. 3. As shown in FIG. 4A, the polar switching circuit 312 comprises plural transistor switches and plural resistors. The polar switching circuit 312 is used for receiving the high DC voltage V1, the low input DC voltage Vm and the digital signal fout, and converting the high DC voltage V1 into the output AC voltages Vo1 and Vo2. As such, the piezoelectric actuator 231 is driven by the Vo1 and Vo2 to result in reciprocating motions. In this embodiment, the polar switching circuit 312 comprises a first resistor R21, a second resistor R22, a third resistor R23, a first transistor switch Q21, a second transistor switch Q22, a third transistor switch Q23, a fourth transistor switch Q24, a fifth transistor switch Q25, a sixth transistor switch Q26 and a seventh transistor switch Q27. Examples of the transistor switches Q21, Q22, Q23, Q24, Q25, Q26 and Q27 include but are not limited to bipolar junction transistors (BJTs). Example of the first resistor R21, the second resistor R22 and the third resistor R23 include but are not limited to current-limiting resistors.

In this embodiment, the first transistor switch Q21 has a base (B), an emitter (E) connected to a ground terminal, and a collector (C) connected to the first resistor R21. The second transistor switch Q22 has a base connected to the collector of the first transistor switch Q21 and the first resistor R21, a collector connected to the ground terminal, and a collector connected to the second resistor R22. The third transistor switch Q23 has a base connected to the second resistor R22 and the collector of the second transistor switch Q22, an emitter connected to the piezoelectric actuator 231, and a collector connected to the second resistor R22. The fourth transistor switch Q24 has a base connected to the first resistor R21, the collector of the first transistor switch Q21 and the base of the second transistor switch Q22, an emitter connected to the ground terminal, and a collector connected to the piezoelectric actuator 231 and the emitter of the third transistor switch Q23. The fifth transistor switch Q25 has a base connected to the third resistor R23, an emitter connected to the piezoelectric actuator 231, and a collector connected to the second resistor R22, the collector of the third transistor switch Q23 and the third resistor R23. The sixth transistor switch Q26 has a base connected to the base of the first transistor switch Q21, an emitter connected to the ground terminal, and a collector connected to the piezoelectric actuator 231. The seventh transistor switch Q27 has a base connected to the base of the first transistor switch Q21, an emitter connected to the ground terminal, and a collector connected to the third resistor R23 and the base of the fifth transistor switch Q25.

Hereinafter, the operations of the polar switching circuit 312 will be illustrated with reference to FIG. 4A. In a case that the digital signal fout is in a high-level state, the transistor switches Q21 and Q26 are conducted, so that the branch of the current-limiting resistor R21 is grounded. In this situation, the transistor switches Q22 and Q24 are conducted, so that the branch of the current-limiting resistor R22 is at a high-level state and the transistor switch Q23 is conducted. On the other hand, since the digital signal fout is in the high-level state, the transistor switch Q27 is conducted, so that the branch of the current-limiting resistor R23 is grounded. In this situation, the transistor switch Q25 is conducted, and thus the current flows in the direction indicated by the arrow. Please refer to FIG. 4B. In a case that the digital signal fout is in a low-level state, the actions of all transistor switches are reversed. That is, the transistor switches Q21 and Q26 are conducted, so that the branch of the current-limiting resistor R21 is in the high-level state. In this situation, the transistor switches Q22 and Q24 are conducted, so that the branch of the current-limiting resistor R22 is grounded and the transistor switch Q23 is conducted. On the other hand, since the digital signal fout is in the low-level state, the transistor switch Q27 is conducted, so that the branch of the current-limiting resistor R23 is in the high-level state. In this situation, the transistor switch Q25 is conducted, and thus the current flows in the direction indicated by the arrow.

Figures 5A, 5B:
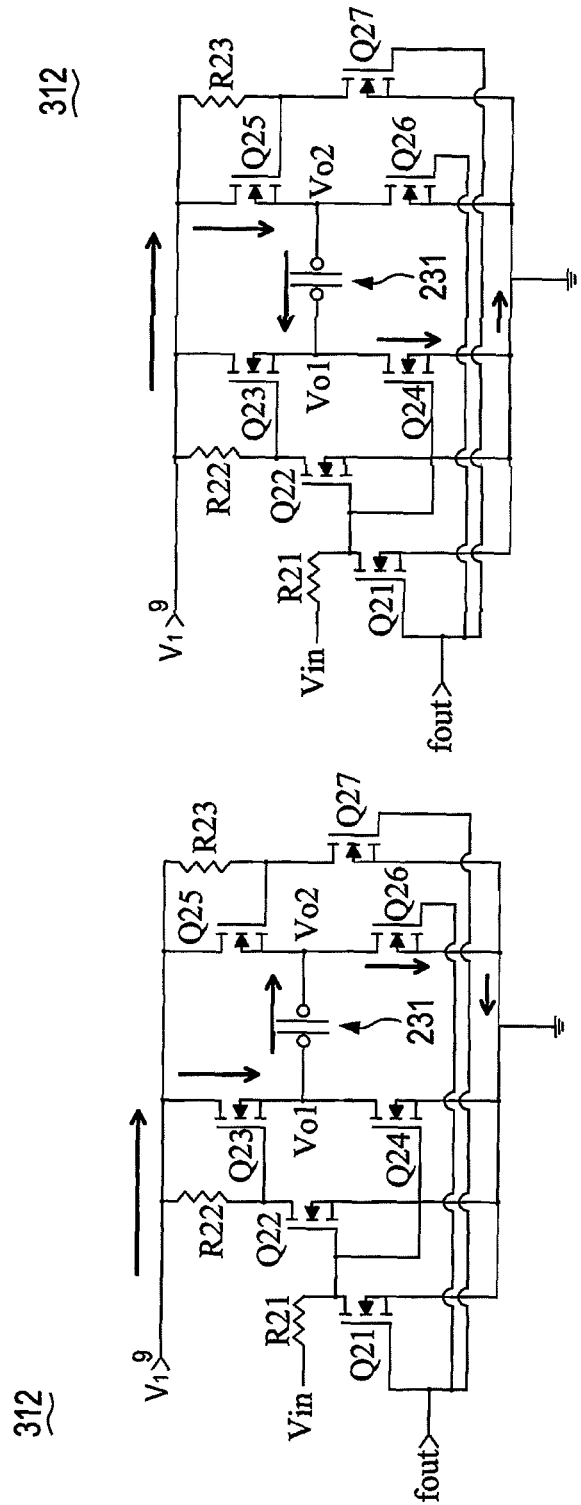
FIG. 5A is a schematic circuit diagram illustrating another polar switching circuit used in the voltage converter of FIG. 3.
FIG. 5B is a schematic circuit diagram illustrating the polar switching circuit of FIG. 5A, in which the digital signal fout is in a low-level state.

In some embodiments, as shown in FIGS. 5A and 5B, the transistor switches of the polar switching circuit 312 are field effect transistors (FETs). As shown in FIGS. 5A and 5B, the polar switching circuit 312 comprises a first resistor R21, a second resistor R22, a third resistor R23, a first transistor switch Q21, a second transistor switch Q22, a third transistor switch Q23, a fourth transistor switch Q24, a fifth transistor switch Q25, a sixth transistor switch Q26 and a seventh transistor switch Q27.

In this embodiment, the first transistor switch Q21 has a gate terminal (G), a source terminal (S) connected to a ground terminal, and a drain terminal (D) connected to the first resistor R21. The second transistor switch Q22 has a gate terminal connected to the drain terminal of the first transistor switch Q21 and the first resistor R21, a drain terminal connected to the ground terminal, and a drain terminal connected to the second resistor R22. The third transistor switch Q23 has a gate terminal connected to the second resistor R22 and the drain terminal of the second transistor switch Q22, a source terminal connected to the piezoelectric actuator 231, and a drain terminal connected to the second resistor R22. The fourth transistor switch Q24 has a gate terminal connected to the first resistor R21, the drain terminal of the first transistor switch Q21 and the gate terminal of the second transistor switch Q22, a source terminal connected to the ground terminal, and a drain terminal connected to the piezoelectric actuator 231 and the source terminal of the third transistor switch Q23. The fifth transistor switch Q25 has a gate terminal connected to the third resistor R23, a source terminal connected to the piezoelectric actuator 231, and a drain terminal connected to the second resistor R22, the drain terminal of the third transistor switch Q23 and the third resistor R23. The sixth transistor switch Q26 has a gate terminal connected to the gate terminal of the first transistor switch Q21, a source terminal connected to the ground terminal, and a drain terminal connected to the piezoelectric actuator 231. The seventh transistor switch Q27 has a gate terminal connected to the gate terminal of the first transistor switch Q21, a source terminal connected to the ground terminal, and a drain terminal connected to the third resistor R23 and the gate terminal of the fifth transistor switch Q25.

The configurations and operating principles of the polar switching circuit 312 as shown in FIGS. 5A and 5B are similar to those of FIGS. 4A and 4B, and are not redundantly described herein.

Figure 6:
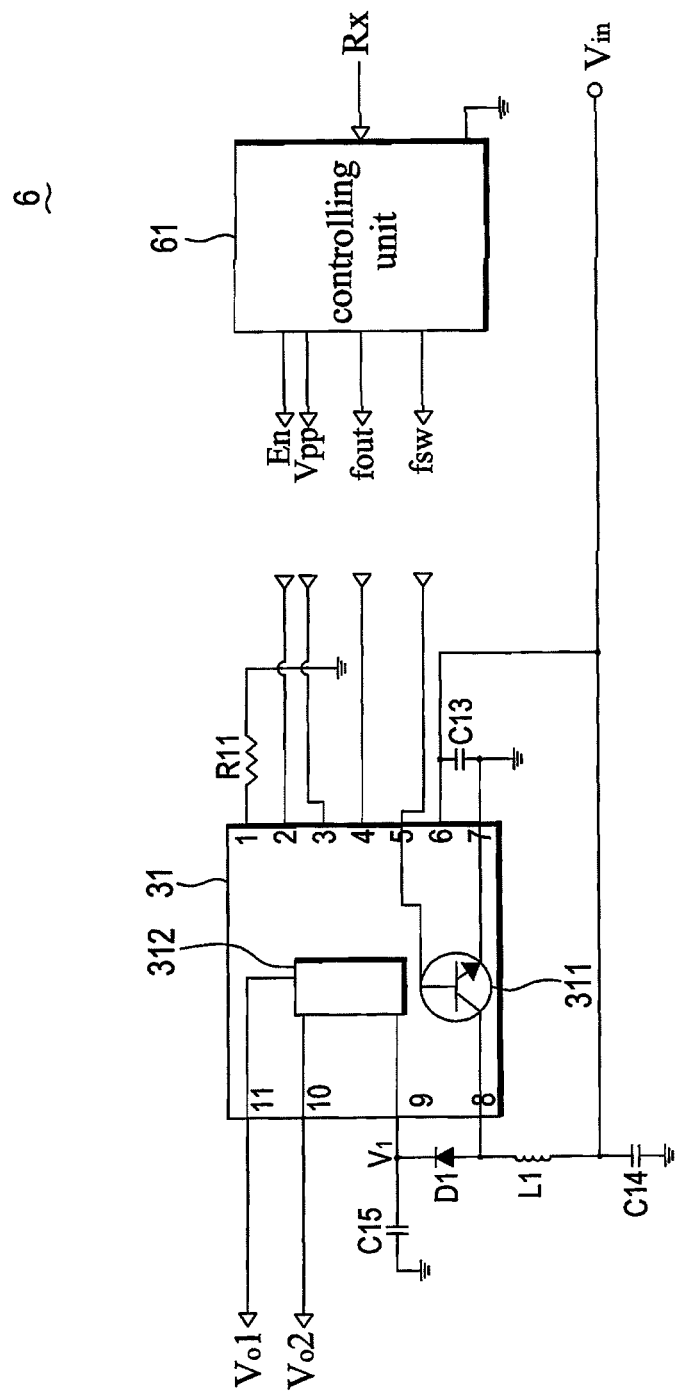
FIG. 6 is a schematic circuit diagram illustrating a second exemplary voltage converter as shown in FIG. 2A.

FIG. 6 is a schematic circuit diagram illustrating a second exemplary voltage converter as shown in FIG. 2A. As shown in FIG. 6, the voltage converter 6 comprises a boost chip 31, a controlling unit 61, capacitors C13, C14 and C15, a resistor R11, an inductor L1 and a diode D1. The boost chip 31 comprises a switch element 311 and a polar switching circuit 312. The operating principles, objects and functions of the switch element 311, the polar switching circuit 312, the capacitors C13, C14 and C15, the resistor R11, the inductor L1 and the diode D1 are similar to those of FIG. 3 in the first embodiment, and are not redundantly described herein.

In this embodiment, a modulation input signal Rx is received by the controlling unit 61. In response to the modulation input signal Rx, the controlling unit 61 simultaneously outputs the digital signals En, fout and fsw and the analog signal Vpp to the boost chip 31, thereby controlling operations of the boost chip 31. According to the digital signal En, the boost chip 31 will control whether the output AC voltages Vo1 and Vo2 are outputted. The functions of the digital signals En, fout and fsw and the analog signal Vpp are similar to those of FIG. 3 in the first embodiment, and are not redundantly described herein.

Figure 7:
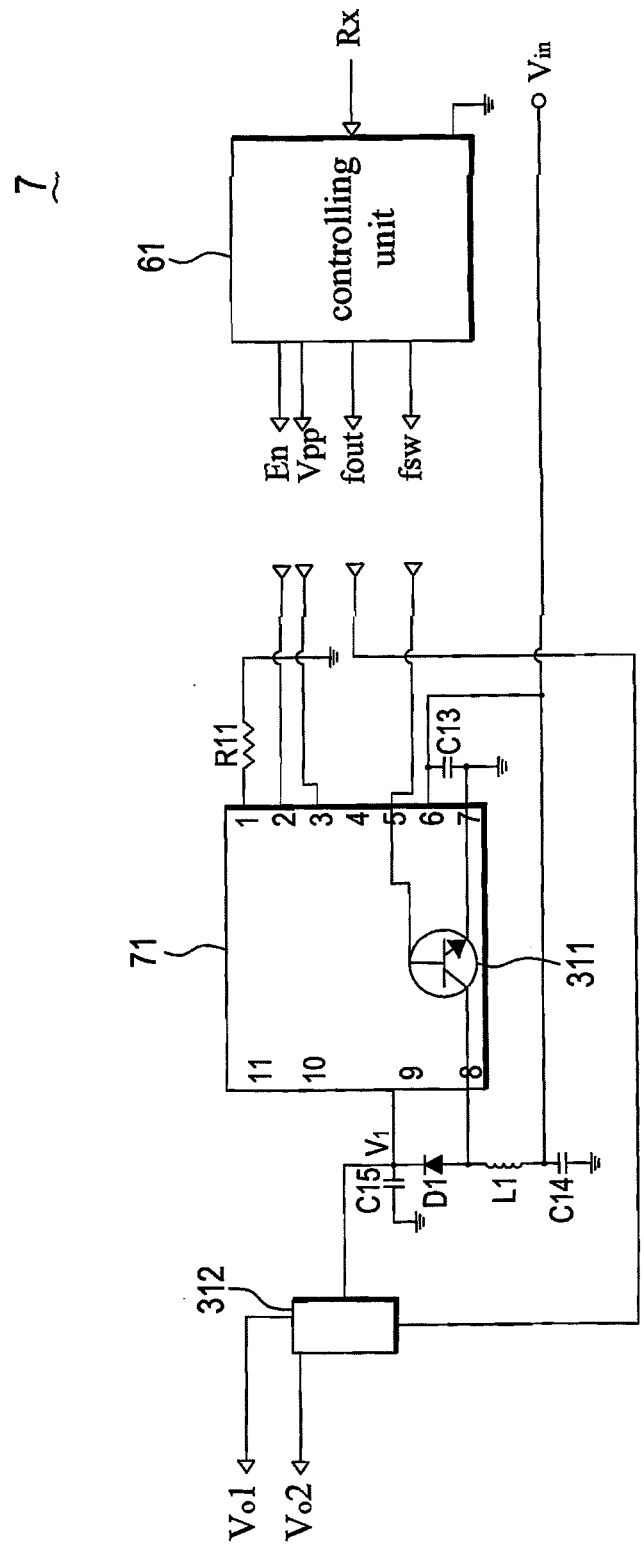
FIG. 7 is a schematic circuit diagram illustrating a third exemplary voltage converter as shown in FIG. 2A.

FIG. 7 is a schematic circuit diagram illustrating a third exemplary voltage converter as shown in FIG. 2A. In the voltage converter 7 of FIG. 7, the polar switching circuit 312 is disposed outside the boost chip 71, and the digital signal fout outputted from the controlling unit 61 is directly transmitted to the polar switching circuit 312. By the boost chip 71, the low input DC voltage Vin is increased to the high DC voltage V1. By the external polar switching circuit 312, the high DC voltage V1 is converted into the output AC voltages Vo1 and Vo2.

The configurations and operating principles of the polar switching circuit 312 and the operating principles of the switch element 311 of the voltage converter 7 are similar to those of FIGS. 3, 4A and 4B in the first embodiment, and are not redundantly described herein.

In this embodiment, the digital signals En, fout and fsw and the analog signal Vpp are outputted from the controlling unit 61 to the boost chip 31.

Figure 8:
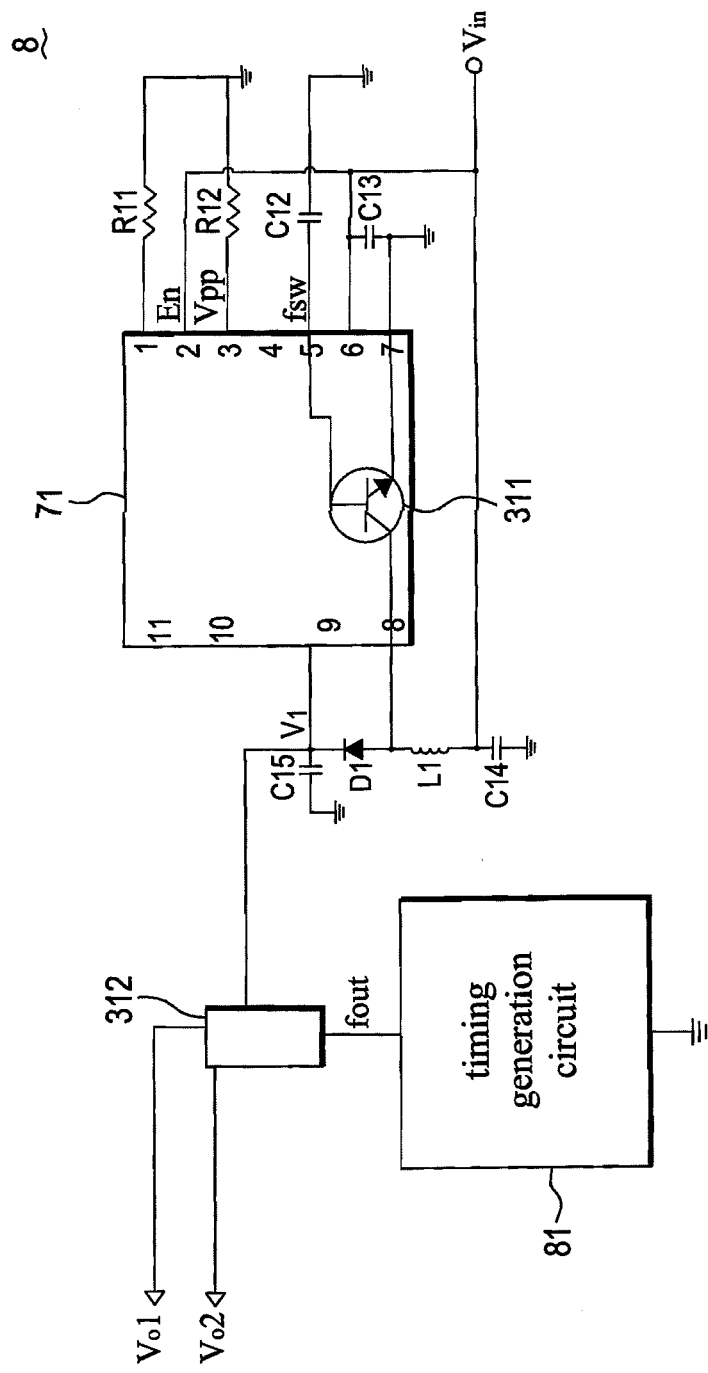
FIG. 8 is a schematic circuit diagram illustrating a fourth exemplary voltage converter as shown in FIG. 2A.

FIG. 8 is a schematic circuit diagram illustrating a fourth exemplary voltage converter as shown in FIG. 2A. As shown in FIG. 8, the voltage converter 8 comprises a timing generation circuit 81 for outputting a digital signal fout to the polar switching circuit 312, thereby controlling the switching frequency of the polar switching circuit 312.

Moreover, in this embodiment, the polar switching circuit 312 is disposed outside the boost chip 71, and the digital signal fout outputted from the timing generation circuit 81 is received by the polar switching circuit 312. By the boost chip 71, the low input DC voltage Vin is increased to the high DC voltage V1. By the external polar switching circuit 312, the high DC voltage V1 is converted into the output AC voltages Vo1 and Vo2.

The configurations and operating principles of the polar switching circuit 312 and the operating principles of the switch element 311 of the voltage converter 8 are similar to those of FIGS. 3, 4A and 4B in the first embodiment, and are not redundantly described herein.

From the above description, the voltage converter and the driving system utilizes the switch element of the boost chip to increase the low input DC voltage to the high DC voltage and then convert the high DC voltage into the output AC voltages in order to drive a piezoelectric actuator of a fluid transportation device. As previously described, the volume of the circuit board of the conventional voltage converter is bulky, and thus the product including the voltage converter fails to meet the miniaturization requirement. According to the present invention, since the amount of components mounted on the circuit board of the voltage converter is reduced, the voltage converter can meet the miniaturization requirement.

Moreover, the amplitudes of the output AC voltages, the frequency of the boost chip and the boost switching frequency of the boost chip can be determined by the oscillation frequency that is generated by the external resistors and capacitors, or adjusted according to the digital signals or analog signal outputted from the external controlling unit.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A voltage converter for receiving a low input DC voltage and driving a piezoelectric actuator of a fluid transportation device, said voltage converter comprising:
   plural capacitors;
   a resistor; and
   a boost chip connected with said plural capacitors and said resistor, having a switch element and a polar switching circuit consisting of plural transistor switches and plural resistors, and receiving said low input DC voltage, wherein said low input DC voltage is increased and multiplied to a high DC voltage by a switching operation of said switch element, and said high DC voltage is converted into an output AC voltage by said polar switching circuit so as to drive said piezoelectric actuator,
   wherein an operating frequency of said boost chip is controlled by said plural capacitors and said resistor.

2. The voltage converter according to claim 1 wherein said plural transistor switches are field effect transistors.

3. The voltage converter according to claim 1 wherein said plural transistor switches are bipolar junction transistors.

4. A voltage converter for receiving a low input DC voltage and driving a piezoelectric actuator of a fluid transportation device, said voltage converter comprising:
   plural capacitors;
   a resistor; and
   a boost chip connected with said plural capacitors and said resistor, having a switch element and a polar switching circuit, and receiving said low input DC voltage, wherein said low input DC voltage is increased and multiplied to a high DC voltage by a switching operation of said switch element, and said high DC voltage is converted into an output AC voltage by said polar switching circuit so as to drive said piezoelectric actuator,
   wherein an operating frequency of said boost chip is controlled by said plural capacitors and said resistor, and the polar switching circuit is composed of plural resistors and plural transistor switches that are bipolar junction transistors, and wherein the polar switching circuit comprises:
   a ground terminal;
   a first resistor;
   a second resistor;
   a third resistor;
   a first transistor switch having a base, an emitter connected to said ground terminal, and a collector connected to said first resistor;
   a second transistor switch having a base connected to said collector of said first transistor switch and said first resistor, a collector connected to said ground terminal, and an emitter connected to said second resistor;
   a third transistor switch having a base connected to said second resistor and said collector of said second transistor switch, an emitter connected to said piezoelectric actuator, and a collector connected to said second resistor;
   a fourth transistor switch having a base connected to said first resistor, said collector of said first transistor switch and said base of said second transistor switch, an emitter connected to said ground terminal, and a collector connected to said piezoelectric actuator and said emitter of said third transistor switch;
   a fifth transistor switch having a base connected to said third resistor, an emitter connected to said piezoelectric actuator, and a collector connected to said second resistor, said collector of said third transistor switch and said third resistor;
   a sixth transistor switch having a base connected to said base of said first transistor switch, an emitter connected to said ground terminal, and a collector connected to said piezoelectric actuator; and
   a seventh transistor switch having a base connected to said base of said first transistor switch, an emitter connected to said ground terminal, and a collector connected to said third resistor and said base of said fifth transistor switch.

5. A voltage converter for receiving a low input DC voltage and driving a piezoelectric actuator of a fluid transportation device, said voltage converter comprising:
   plural capacitors;
   a resistor; and
   a boost chip connected with said plural capacitors and said resistor, having a switch element and a polar switching circuit, and receiving said low input DC voltage, wherein said low input DC voltage is increased and multiplied to a high DC voltage by a switching operation of said switch element, and said high DC voltage is converted into an output AC voltage by said polar switching circuit so as to drive said piezoelectric actuator,
   wherein an operating frequency of said boost chip is controlled by said plural capacitors and said resistor, and the polar switching circuit is composed of plural resistors and plural transistor switches, and wherein the polar switching circuit comprises:
   a ground terminal;
   a first resistor;
   a second resistor;
   a third resistor;
   a first transistor switch having a gate terminal, a source terminal connected to said ground terminal, and a drain terminal connected to said first resistor;
   a second transistor switch having a gate terminal connected to said drain terminal of said first transistor switch and said first resistor, a source terminal connected to said ground terminal, and a drain terminal connected to said second resistor;
   a third transistor switch having a gate terminal connected to said second resistor and said drain terminal of said second transistor switch, a source terminal connected to said piezoelectric actuator, and a drain terminal connected to said second resistor;
   a fourth transistor switch having a gate terminal connected to said first resistor, said drain terminal of said first transistor switch and said gate terminal of said second transistor switch, a source terminal connected to said ground terminal, and a drain terminal connected to said piezoelectric actuator and said source terminal of said third transistor switch;
   a fifth transistor switch having a gate terminal connected to said third resistor, a source terminal connected to said piezoelectric actuator, and a drain terminal connected to said second resistor, said drain terminal of said third transistor switch and said third resistor;
   a sixth transistor switch having a gate terminal connected to said gate terminal of said first transistor switch, a source terminal connected to said ground terminal, and a drain terminal connected to said piezoelectric actuator; and a seventh transistor switch having a gate terminal connected to said gate terminal of said first transistor switch, a source terminal connected to said ground terminal, and a drain terminal connected to said third resistor and said gate terminal of said fifth transistor switch.

6. A voltage converter for receiving a low input DC voltage and driving a piezoelectric actuator of a fluid transportation device, said voltage converter comprising:

a boost chip having a switch element, and receiving said low input DC voltage, wherein said low input DC voltage is increased and multiplied to a high DC voltage by a switching operation of said switch element;

a polar switching circuit having plural transistor switches and plural resistors and connected with said boost chip for converting said high DC voltage into an output AC voltage so as to drive said piezoelectric actuator;

a timing generation circuit connected with said polar switching circuit for controlling an operating frequency of said polar switching circuit; and a resistor and a capacitor connected with said boost chip for controlling an operating frequency of said boost chip.

* * * * *